United States Patent [19]

Steingroever

[11] 4,058,763
[45] Nov. 15, 1977

[54] APPARATUS FOR AUTOMATICALLY MAGNETIZING PERMANENT MAGNET BODIES, MEASURING THEIR MAGNETIC RETENTIVITY AND SORTING THEM

[75] Inventor: Erich Steingroever, Bonn, Germany

[73] Assignee: Elektro-Physik Hans Nix & Dr. Ing. Erich Steingroever KG, Cologne, Germany

[21] Appl. No.: 555,899

[22] Filed: Mar. 6, 1975

[30] Foreign Application Priority Data

Mar. 11, 1974 Germany .............................. 2411485

[51] Int. Cl.² .......................................... G01R 33/12
[52] U.S. Cl. .................................. 324/205; 209/81 A
[58] Field of Search ................ 324/34 R, 34 PE, 42; 209/81 A, 81 R, 111.8; 336/83, 112; 317/157.5 R, 157.5 PM; 335/284

[56] References Cited

U.S. PATENT DOCUMENTS

| | | | |
|---|---|---|---|
| 2,427,774 | 9/1947 | Fredrickson | 324/42 |
| 2,822,088 | 2/1958 | Beaumont et al. | 324/34 H |
| 3,139,567 | 6/1964 | Atkinson | 335/284 |
| 3,365,660 | 1/1968 | Steingroever | 324/34 R |
| 3,430,133 | 2/1969 | Greiner et al. | 324/37 |
| 3,478,876 | 11/1969 | Littwin et al. | 324/34 R |
| 3,586,164 | 6/1971 | Pool | 324/34 H |
| 3,624,572 | 11/1971 | Mallinson | 335/284 |
| Re. 21,927 | 10/1941 | Brace et al. | 324/34 R |

FOREIGN PATENT DOCUMENTS

| | | | |
|---|---|---|---|
| 1,489,983 | 5/1969 | Germany | 336/212 |
| 140,496 | 4/1960 | U.S.S.R. | 324/42 |

Primary Examiner—Robert J. Corcoran
Attorney, Agent, or Firm—George H. Mitchell, Jr.

[57] ABSTRACT

An elongated generally U-shaped ferromagnetic yoke has a series of coils embedded in its leg portions at spaced positions along its length so that a magnet body can be moved along the length of the air gap of the yoke so that it can be magnetized and measured for a magnetic characteristic. A conveyor and a sorting device are also included so that magnet bodies exceeding minimum standards can be selected automatically. Other functions, such as partial demagnetization, and complete demagnetization, can be accomplished by other coils, or permanent magnets, embedded in the yoke.

27 Claims, 8 Drawing Figures

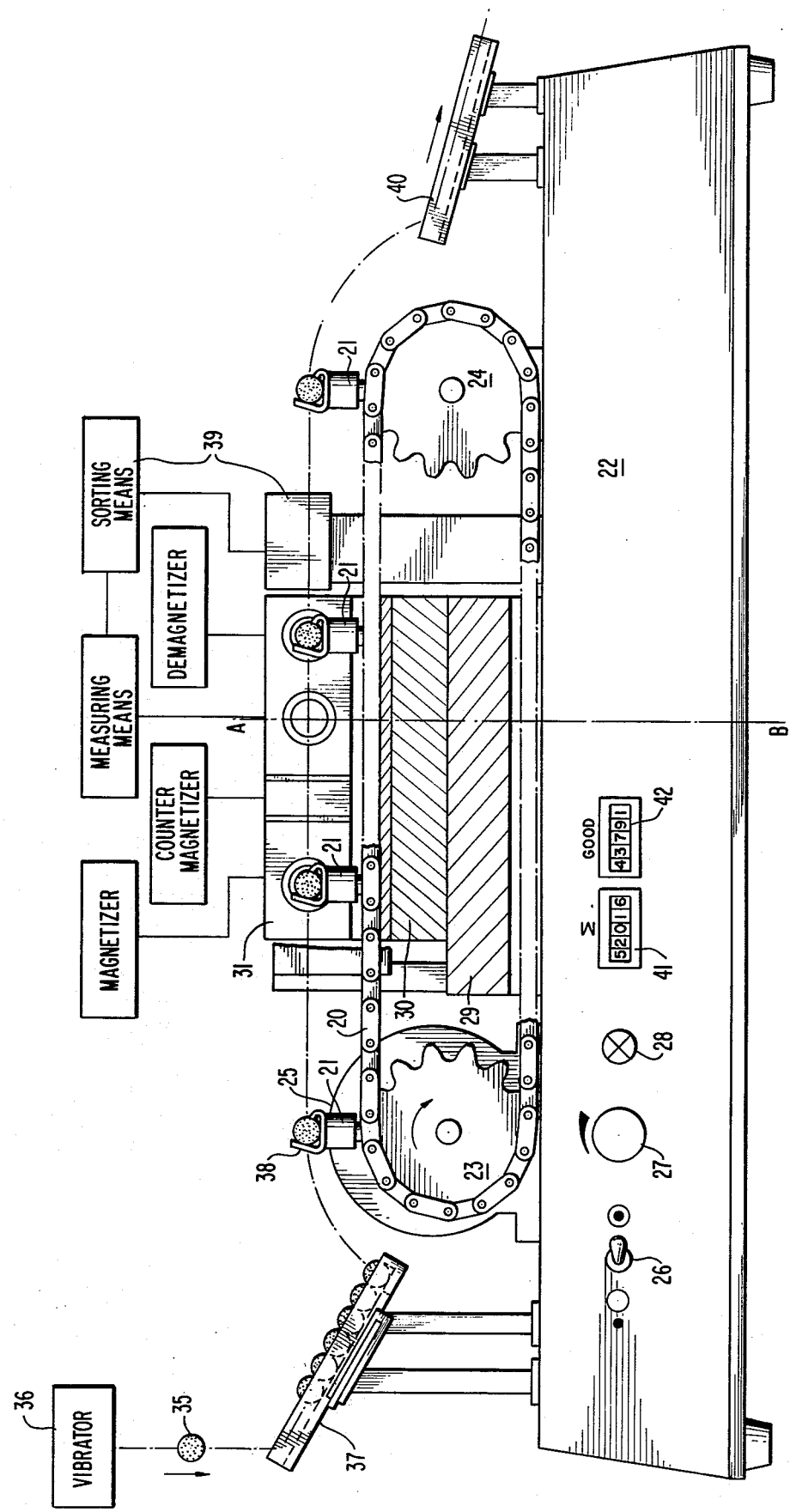

APPARATUS FOR AUTOMATICALLY MAGNETIZING PERMANENT MAGNET BODIES, MEASURING THEIR MAGNETIC RETENTIVITY AND SORTING THEM

The present invention relates to a testing device for permanent magnets which enables large quantities of magnets to be tested automatically to determine their magnetic value.

Characteristic of permanent magnets is the demagnetization curve in the second quadrant of the hysteresis curve between remanence $B_r$ and the coercive forces $_BH_c$ or $_JH_c$.

To test permanent magnets, it is generally sufficient to determine a point on the demagnetization curve or a point on an inner magnetizing curve through which the permanent magnet passes after it has been acted on by a demagnetizing counterfield.

In the case of a known testing device for permanent magnets, the magnet is placed in a yoke having an air gap corresponding to the desired working point. After magnetization, a surrounding induction coil is removed from the middle of the magnet by pulling apart the yoke and the voltage impulse induced in the course thereof measured with a fluxmeter. This voltage impulse constitutes a measurement of the magnetic flux in the magnet at the desired working point. Continuous, automatic testing of permanent magnets cannot be carried out with this known device.

The automatic testing device according to the invention, has an essentially C or U-shaped yoke of soft iron having low coercivity which provides for good reproducibility of measurements, in the poles of which means for magnetizing, countermagnetizing, measuring and/or demagnetizing the magnets to be tested are arranged adjacent to each other.

The magnets to be tested are passed in succession across these means incorporated in the poles.

According to the invention, the poles of the yoke form between them a gap which is of identical length or longer than the magnets to be tested. When the gap is the same length as the magnets, the magnets are measured at the remanence point. When the air gap is longer, the magnets are measured at a point on the demagnetizing curve in the second quadrant of the hysteresis curve. By selecting the length of the air gap, the position of this working point can be determined. To maintain the spacing and to protect the pole faces, the air gap between the poles of the yoke and the magnets to be tested may be filled with an interchangeable non-magnetic wear plate, for example, a bronze plate.

The yoke according to the invention is C or U-shaped and the magnets to be tested are therefore easily accessible in every position, enabling them to be removed in the event of faults or wedging and enabling the magnetic flux passing through them to be measured in every position by means of a surrounding coil and a fluxmeter to obtain the desired working point.

According to the invention, the open side of the yoke may also be closed by an armature which is detachable or hinged in the region of the magnetizing and demagnetizing coils.

Other objects, features and advantages of the present invention will be made apparent from the following detailed description of the preferred embodiment thereof which is provided with reference to the accompanying drawings.

FIG. 5 is an elevational view (with the yoke means shown in section) of a preferred form of testing device in accordance with this invention;

Figure 1:
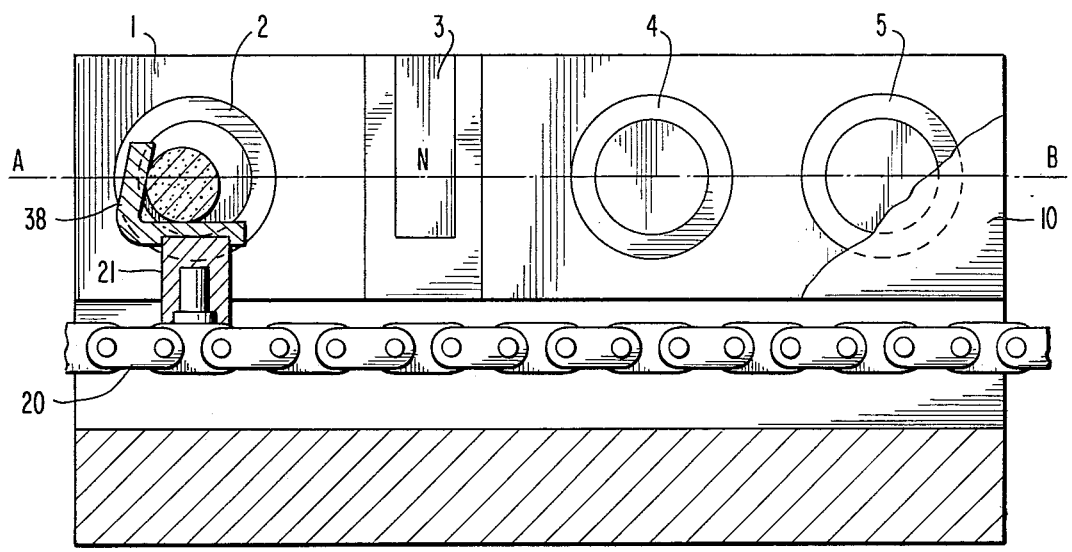
FIG. 1 is a vertical cross-section through the center of a preferred form of U-shaped yoke means constructed in accordance with the invention, taken on the line A-B of FIG. 2.
Figure 2:
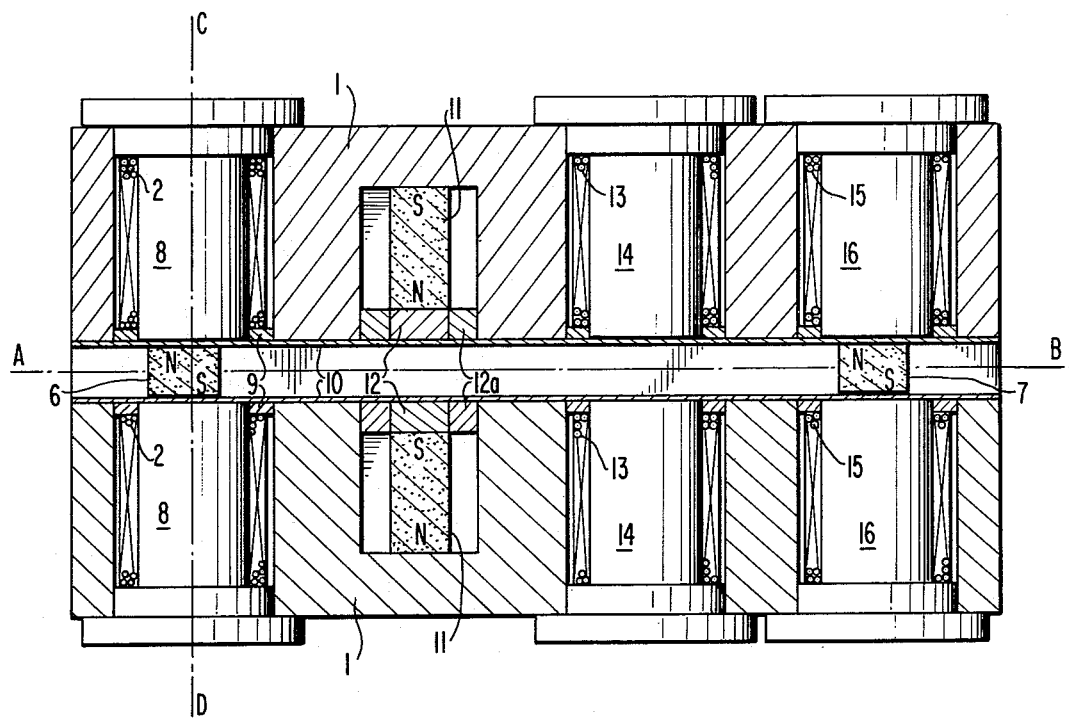
FIG. 2 is a horizontal cross-section taken on the line A-B of FIG. 1.
Figure 3:
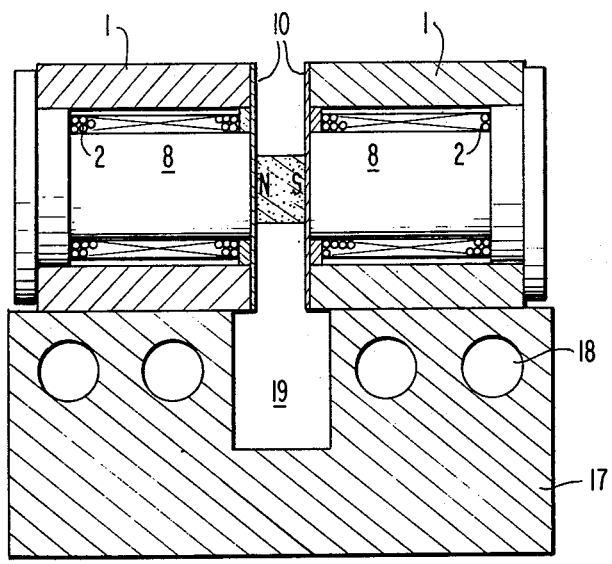
FIG. 3 is a vertical transverse cross-section taken on the line C-D of FIG. 2.
Figure 7:
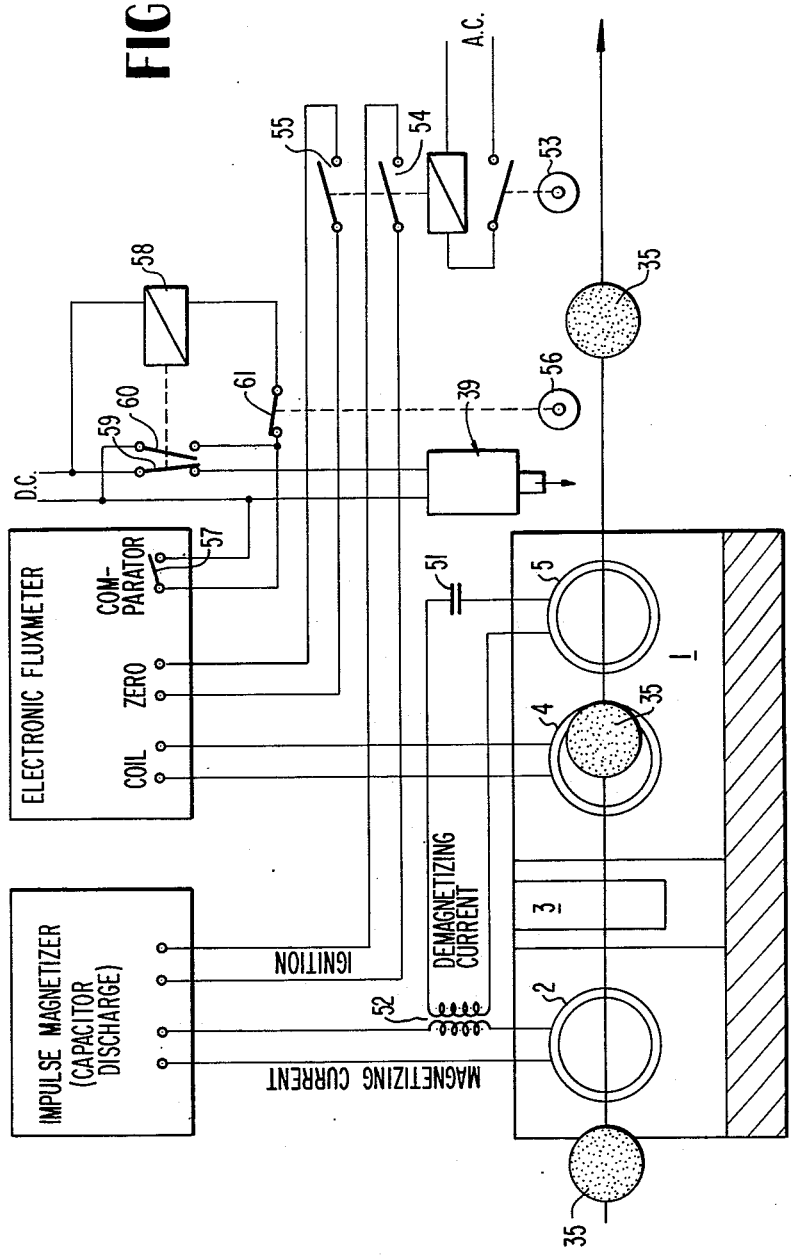
FIG. 7 is a circuit diagram for energizing the various elements of the yoke means.

In FIGS. 1–3, the numeral 1 designates the two pole pieces of an elongated iron yoke which is generally U-shaped in transverse cross-section. Numeral 2 designates the coil of a magnetizing means which is received in a recess in the yoke and is preferably energized by a high current impulse supplied by capacitor discharge as shown in FIG. 7. Such circuits are well known in the art; the magnetization means 2 could also consist of a permanent magnet fitted into the recess. A counter-magnetizing means, which partially demagnetizes the previously magnetized magnet body, is indicated by numeral 3 and may comprise a permanent magnet system inserted into recesses in the pole pieces 1, of the yoke means with the N pole facing the N pole of the magnet body which has just been magnetized. Numeral 4 indicates a means for measuring a magnetic characteristic of the already magnetized body and it includes a coil embedded in the pole piece 1 in the same way as coil 2. Coil 4 may be connected to a fluxmeter, as shown in FIG. 7, or to some other type of measuring, or indicating, device, or may by replaced by some other type of measuring device such as a Hall effect probe. Numeral 5 designates a demagnetizing device, which may consist of a coil embedded in pole piece 1, and connected with a source which supplies a high, alternating current of decreasing amplitude as shown in FIG. 7.

The opposing poles of the yoke are provided with magnetizing, counter-magnetizing, measuring and demagnetizing means and are mirror images of each other, as shown in section in FIG. 2.

The magnets 6 and 7 to be tested are represented in positions 2 and 5. Magnet 6 is in the process of being magnetized and magnet 7 is in the process of being demagnetized.

The two magnetizing coils 2 are wound on soft iron cores 8. The winding is closed on the pole face side by the non-magnetic ring 9. The gap between the pole faces and the magnets is filled with the wear plates 10.

The counter-magnetizing magnetic field in position 3 consists of a permanent magnet 11 having the poles N and S which are let into recesses in the pole faces and bear the soft iron pole piece 12. The direction of the magnetic field between the poles 12 is opposite to that produced by the magnetizing coils 2. The strength of the counter field can be adjusted by magnetic shunts 12a.

The measuring coils 13 in position 4 are wound on the pole cores 14, and are connected in series and also connected to a fluxmeter which produces a signal for sorting the magnets when a preset value of the flux is attained.

The magnets thereafter pass the demagnetizing coils 15 in position 5. The coils 15 are wound on soft iron pole cores 16 and are connected to a current source which supplies a high, alternating current of decreasing amplitude at the time when the magnets are in position 5.

The pole cores of the various coils are interchangeably arranged in the inner lateral faces of the pole 1 of the yoke. The perforated line designated by A-B represents the course of the magnets to be tested through the testing device.

FIG. 3 shows a cross-section C-D through the testing device. The poles 1 of the yoke are adjustably arranged on the base 17 so that various gaps may be engaged betweeen the magnets to be tested and the inner faces of the poles. The base 17 is provided with longitudinal bore holes 18 for carrying a cooling fluid. It is also provided with a passage 19 in which a conveyor 20 (see FIG. 5), for example, an endless link chain provided with the grippers 21, is disposed. A part of this chain and a gripper are represented in FIG. 1. Switches (not shown) which trigger the magnetizing, demagnetizing and/or sorting operations may be activated by the grippers.

Figure 4:
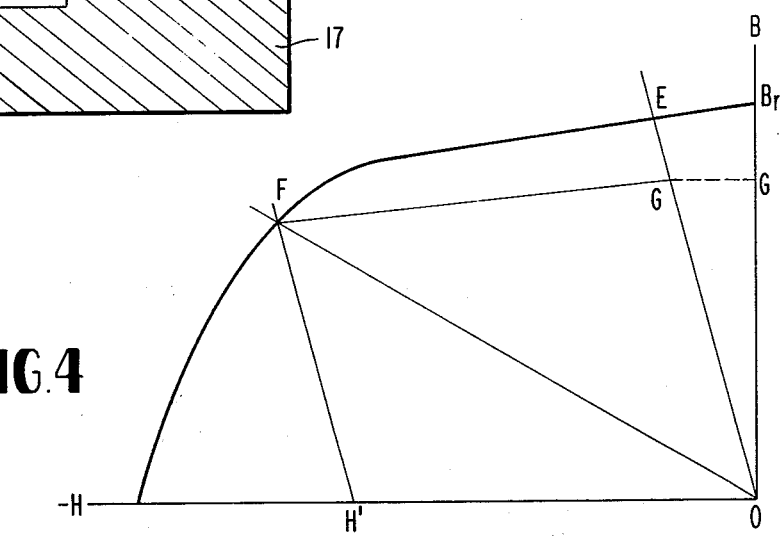
FIG. 4 is a diagram of the second quadrant of a hysteresis curve illustrating various working points.

FIG. 4 shows the second quadrant of a hysteresis curve of a permanent magnet. After being magnetized in position 2, a magnet passing through the testing device according to the invention occupies the working point E which is close to the remanence point $B_r$ dependent upon the load line determined by the air gap between the magnet and the pole faces. On passing the counter-field H in position 3, the working point is shifted towards F and returned again to G. The measurement value of the fluxmeter in G corresponds to the product of G and the cross-section of the magnet.

The embodiment of the invention represented in FIGS. 1-3 is characterized in that identical means for magnetizing, counter-magnetizing, measuring and demagnetizing the magnets are arranged one beside the other and opposite to each other in the manner of a mirror image in the two side faces of the yoke. However, these can also be provided only on one side of the pole pieces of the yoke.

According to the invention, a coil having an adjustable field intensity can also be provided in one or both poles of the yoke as a substitute for the magnets 3 for the purpose of counter-magnetizing the magnets. The field of this coil is oppositely directed to the magnetizing direction of the magnets.

The coils for measuring the flux densities of the magnets may either have a larger cross-section than the magnets as represented in FIGS. 1-3, so that the total flux path through the magnets is picked up, or they may have a smaller cross-section than the magnets so that they only cover a portion of the cross-section of the magnets. In this case, it is not necessary to determine the total cross-section of the magnets, as only a spot on the magnet is measured giving the flux density in that working point, as disclosed in U.S. Pat. No. 3,365,660.

In place of the coils for measuring the flux density B, potential pole coils may be provided for measuring the inner field strength H. These project through the interior of the measuring poles 14 and possibly through bore holes of the wear plates 10 as far as the surface of the magnets, as disclosed and claimed in my copending application Ser. No. 414,324, filed Nov. 9, 1973, now U.S. Pat. No. 3,925,724.

According to the invention, a sorting device 39, which is well known in the art, is controlled in response to the measurement determined by the measuring coil or coils 4. When the magnets leave the testing device at B, the sorting device 39 separates them into "good" magnets and "rejects". This can be effected by means of a solenoid operated flap or deflector, the position of which is controlled by a comparison circuit connected with the fluxmeter in accordance with the measurement value.

The demagnetizing coils are supplied with a high alternating current of decreasing amplitude. According to the invention, this current can be obtained from the impulse of the magnetizing device which supplies the magnetizing coil 2, while an oscillating circuit consisting of the coil or coils 15 and a capacitor 51 is connected by transformer means 52 (See FIG. 8) to the circuit of the magnetizing coil 2 and is triggered by the magnetizing impulse to oscillation of decreasing amplitude. For example, transformer 52 may comprise two coils wound on the pole core or cores 16. One of these is connected in series with the magnetizing coil 2 and the other forms a demagnetizing oscillating circuit with capacitor 51.

According to the invention, the integrally formed yoke shown in FIGS. 1-3 may also be constructed as a multipart yoke to avoid reciprocal influencing of the magnetizing, counter-magnetizing, measuring and demagnetizing means. It is also within the scope of the invention only to incorporate part of these means in the yoke, for example, the yoke might include only the magnetizing coils and the measuring coils, or these two types of coils and the demagnetizing coils.

FIG. 5 is a side view of a partial section of the permanent magnet testing device according to the invention. Two chain wheels 23 and 24 are mounted on a base support 22. A chain 20 driven by a motor 25 passes over the chain wheels 23 and 24. The motor 25 is engaged by means of the switch 26 and its speed is regulated by means of the regulator 27. 28 is an electric safety mechanism of the motor.

Figure 6:
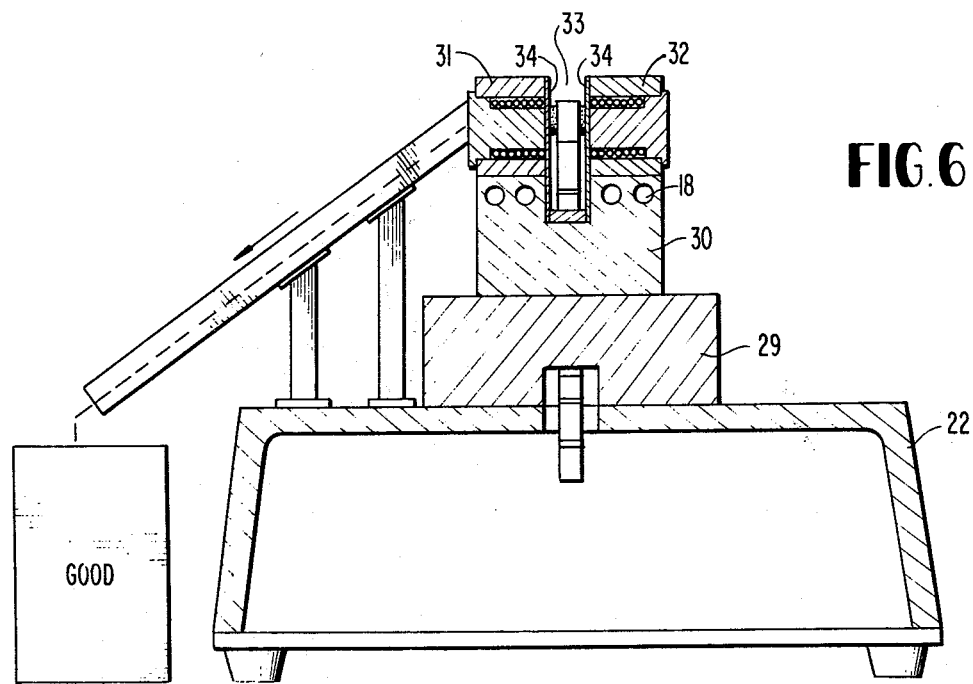
FIG. 6 is a transverse cross-section on the line A-B of FIG. 5.

The back 30 of the U-shaped iron yoke is secured to an intermediate part 29 on the base support 22 and the pole piece 31 is located opposite to the pole piece 32 shown in FIG. 6 and it forms with the same an air gap 33 provided with wear plates 34. The magnets 35 to be tested are moved by a vibrator 36 onto a slide 37 where they are gripped by the gripper 21 comprising interchangeable hooks 38. The magnets are moved through the magnetizing, counter-magnetizing, measuring and demagnetizing means disclosed in FIG. 1 and are ejected as "good" by the ejector 39 or are separated out as "rejects" on the slide 40.

The grippers activate a contact 53 (FIG. 7) which operates switches 54 and 55 for initiating the magnetizing and demagnetizing impulses and for setting the fluxmeter at zero. They also activate a counter 41 which indicates the number of magnets tested and a counter 42 which indicates the number of magnets which are considered "good", as well as the contact 56 which controls the sorting device 39, as will be explained below.

Figure 8:
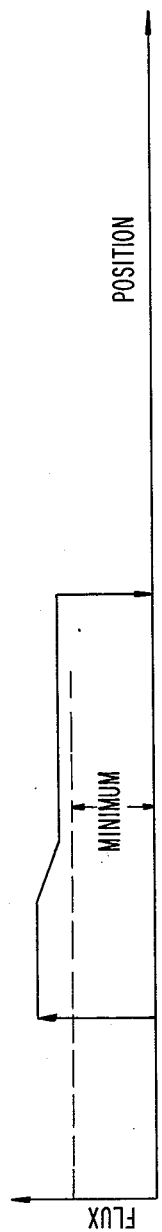
FIG. 8 is a diagram illustrating changes in the flux density of a magnet body as it passes through the yoke means, shown schematically above the diagram.

The graph of FIG. 8 indicates with a horizontal broken line, the minimum acceptable level of a magnetic characteristic being measured by the fluxmeter. The solid line illustrates the values in a magnet body as it passes through the various positions of the yoke shown above in FIG. 7 and it will be observed that at the magnetizing position 2, the value is highest. This value is reduced as the magnet passes through the counter-magnetizing position 3 and after being measured at position 4, the value is reduced to zero at the demagnetizing station 5. It should also be noted that by spacing the grippers 21 along the chain 20 a distance equal to the distance between the magnetizing position 2 and the demagnetizing position 5, it is possible to initially magnetize one magnet body simultaneously with the demagnetization of a preceding magnet body which has been measured at position 4. When the measured value of a magnet passing through measuring station 4 exceeds its minimum value, the comparator circuit of the fluxmeter closes the switch 57 which energizes solenoid 58 to open switch 59 and close switch 60.

Opening of switch 59 deenergizes the ejector 39 and closing of switch 60 completes a circuit through switch 61 to maintain energization of solenoid 58 after comparator switch 57 has reopened. When the gripper 21 then activates contact 56, it opens switch 61, which deenergizes solenoid 58 causing the reclosing of switch 59, energizing the ejector 39, and resetting switch 60 to its open position.

What is claimed is:

1. In apparatus for automatically testing and selecting permanent magnet bodies having oppositely facing pole surfaces, the combination comprising generally U-shaped ferromagnetic yoke means having opposed inner pole surfaces defining an elongated air gap of uniform width within which gap magnet bodies may be received, circuit means for said yoke means including means for generating a magnetizing flux through a magnet body at at least one position along the length of said air gap and including means for measuring a magnetic value of said magnetized magnet body at another position along the length of said air gap, said circuit means also including comparison means responsive to said measuring means for selecting magnet bodies having predetermined values of said measured magnetic characteristic, and conveyor means for moving a magnet body successively to said one position and to said measuring position.

2. The invention defined in claim 1, wherein said yoke means includes coil means in said circuit means at said one position for magnetizing a magnet body.

3. The invention defined in claim 2, wherein said circuit means includes impulse magnetizing means connected with said coil means actuated by said conveyor means for automatically magnetizing magnet bodies at said one position.

4. The invention defined in claim 2, wherein said yoke means includes means for generating a counter magnetizing flux through a magnet body at a third position along the length of said elongated air gap, said conveyor means including means for moving a magnet body successively to said one position, said third position and said another position.

5. The invention defined in claim 4, wherein said counter-magnetizing means includes at least one permanent magnet means disposed in the flux path at said third position.

6. The invention defined in claim 5, wherein said permanent magnet means includes magnetic field adjusting shunt means.

7. The invention defined in claim 2, wherein said yoke means includes means for generating a flux through a magnetic body at a demagnetizing position along the length of said elongated air gap, said circuit means including means for demagnetizing the body at the demagnetizing position.

8. The invention defined in claim 7, wherein said conveyor means includes means for holding a first magnet body at said one position for magnetization and a second magnet body at the demagnetizing position at the same time, and said circuit means includes means for respectively magnetizing and demagnetizing said first and second bodies simultaneously.

9. The invention defined in claim 8, wherein said circuit means includes demagnetizing coil means disposed at said demagnetizing position, means connecting the coil means at said one position with one side of an electrical transformer and a source of DC current, and means for connecting the other side of said transformer with capacitor means and said demagnetizing coils to generate decaying AC current therein.

10. In apparatus for testing permanent magnet bodies having oppositely directed pole surfaces, the combination comprising a generally U-shaped, elongated ferromagnetic yoke means, the two projecting leg portions of said yoke means defining a uniform air gap along the length thereof, with a plurality of controllable transverse flux paths through the air gap defined by the leg portions of said yoke means at spaced positions along the length thereof, at least one of said flux paths including a coil means embedded in at least one of said leg portions, and one of said transverse flux paths including magnetic field measuring means.

11. The invention defined in claim 10, wherein said coil means includes a ferromagnetic core means inserted into a transverse bore provided in one of said leg portions having a pole surface at one end in alignment with the inner surface of the leg portion.

12. The invention defined in claim 10, wherein at least two controllable transverse flux paths are provided in said yoke means, each of said paths including a coil means and a ferromagnetic core means inserted into respective transverse bores provided in one of said leg portions, each of said core means having a pole surface in alignment with each other.

13. The invention defined in claim 12, wherein a pair of elongated wear plates of thin non-magnetic material are applied to the inner surfaces of the leg portions of said yoke means.

14. The invention defined in claim 12, wherein a permanent magnet means is disposed within a recess in at least one of said leg portions having a pole surface in longitudinal alignment with the pole surfaces of said pair of core means and at a position spaced between said core means.

15. The invention defined in claim 14, wherein a pair of elongated wear plates of thin non-magnetic material are applied to the inner surfaces of the leg portions of said yoke means.

16. The invention defined in claim 15, wherein said permanent magnet means includes magnetic field adjusting shunt means.

17. The invention defined in claim 12, wherein the inner surfaces of the leg portions of the yoke means lie in parallel planes, said leg portions being joined to each other at their lower ends by a base of ferromagnetic material, at least one of said leg portions being slidable on said base for shiftable movement toward and away from the other leg portion to accommodate magnet bodies of different lengths in said flux paths.

18. The invention defined in claim 17, wherein said yoke means includes three separate core means each surrounded by a coil, each of said core means being disposed in longitudinal alignment and at three positions spaced from each other along the length of the core means to define three separate flux paths across the air gap.

19. The invention defined in claim 18, wherein at least two of said core means are embedded in one of said leg portions and are provided with pole faces disposed in a common plane parallel with the planes of the inner surfaces of the leg portions.

20. The invention defined in claim 19, wherein a pair of elongated wear plates of thin non-magnetic material are applied to the inner surfaces of the leg portions.

21. The invention defined in claim 17, wherein said yoke means comprises three elongated blocks of ferromagnetic material, one of said blocks defining a base and being provided with guide means for a conveyor means to move magnet bodies successively through said flux paths, the remaining two blocks defining the leg portions of the yoke means and being separably joined to the base on opposite sides of said guide means for shiftable movement to and away from each other to accomodate magnet bodies of varying lengths, at least one of said flux paths being defined by a pair of core elements respectively received in a cylindrical bore provided in each of the remaining two blocks in axial alignment with each other, and coil means surrounding each of said core elements in each bore.

22. The invention defined in claim 21, wherein a second flux path is defined by a second pair of core elements and coil means received in a second bore provided in each of the remaining two blocks in axial alignment with each other, said coil means being respectively connected with a circuit means for magnetizing a magnet body in one of said flux paths and demagnetizing a magnet body in the other of the flux paths.

23. The invention defined in claim 22, wherein said conveyor means includes gripping means for holding different magnet bodies in both of said flux paths at the same time, and said apparatus includes circuit means for initiating energization of said flux paths simultaneously.

24. The invention defined in claim 23, wherein a third flux path disposed between the other two flux paths is defined by a third pair of core elements and coil means received in a third bore provided in each of the remaining two blocks in axial alignment with each other.

25. The invention defined in claim 24, wherein each of the remaining two blocks are provided with oppositely facing recesses, and a permanent magnet is received in each of said recesses for countermagnetizing a magnet body, each said permanent magnet being provided with a pole piece of magnetically soft material.

26. The invention defined in claim 25, wherein a pair of wear plates of non-magnetic material are positioned along the length of the inner surfaces of the blocks defining the leg portions in alignment with the respective end surfaces of magnet bodies conveyed through the flux paths.

27. The invention defined in claim 26, wherein said guide means comprises an elongated slot to slidingly receive a conveyor means.

* * * * *